United States Patent [19]

Flannagan

[11] Patent Number: 5,043,602
[45] Date of Patent: Aug. 27, 1991

[54] HIGH SPEED LOGIC CIRCUIT WITH REDUCED QUIESCENT CURRENT

[75] Inventor: Stephen T. Flannagan, Austin, Tex.

[73] Assignee: Motorola, Inc., Schaumburg, Ill.

[21] Appl. No.: 498,530

[22] Filed: Mar. 26, 1990

[51] Int. Cl.[5] .................. H03K 19/086; H03K 19/02; H03K 5/12

[52] U.S. Cl. .................... 307/455; 307/542; 307/546; 307/446; 307/570; 307/263

[58] Field of Search .................. 307/443, 454–455, 307/542, 546, 263, 446, 570, 530, 355

[56] References Cited

U.S. PATENT DOCUMENTS

| | | | |
|---|---|---|---|
| 3,458,719 | 7/1969 | Weiss | 307/455 |
| 4,346,312 | 8/1982 | Christopherson | 307/455 |
| 4,737,663 | 4/1988 | Varadarajan | 307/455 |
| 4,751,410 | 6/1988 | Tanizawa | 307/570 |
| 4,816,705 | 3/1989 | Ohba et al. | 307/447 |
| 4,845,385 | 7/1989 | Ruth, Jr. | 307/446 |
| 4,908,794 | 3/1990 | Yamaguchi | 307/446 |
| 4,939,393 | 7/1990 | Petty | 307/455 |
| 4,948,990 | 8/1990 | Shin et al. | 307/446 |
| 4,980,582 | 12/1990 | Wallen et al. | 307/455 |

OTHER PUBLICATIONS

ECLICs Play a Role in High-Speed Computers, by John Gallant, EDN, vol. 34, No. 17, pp. 73–85, 80 (Aug. 17, 1989).

Motorola MECL System Design Handbook, No. HB206R1, pp. 10–12.

*Primary Examiner*—Stanley D. Miller
*Assistant Examiner*—Margaret Rose Wambach
*Attorney, Agent, or Firm*—Paul J. Polansky

[57] ABSTRACT

A high speed logic circuit with reduced quiescent current receives a plurality of input signals and performs a predetermined logic operation on the plurality of input signals. The predetermined logic operation may be, for example, a comparison of true and complement input signals, or a logical AND of two input signals. In response to the predetermined logic operation, first and second bipolar transistors coupled between first and second power supply voltage terminals are alternately made conductive to provide an output signal therebetween at ECL levels. A biasing portion ensures a proper voltage on a base of the second bipolar transistor. A current portion draws current from the base of the second bipolar transistor until the voltage of the output signal reaches a logic low voltage, and then makes the second transistor nonconductive, keeping the quiescent current of the circuit to a minimum.

11 Claims, 4 Drawing Sheets

HIGH SPEED LOGIC CIRCUIT WITH REDUCED QUIESCENT CURRENT

FIELD OF THE INVENTION

This invention relates generally to high speed logic circuits requiring low quiescent current, and more particularly, to high speed logic circuits using CMOS and bipolar transistors.

BACKGROUND OF THE INVENTION

Bipolar transistors are useful for performing logic operations in applications in which speed is critical. One use of bipolar transistors is emittercoupled logic (ECL) technology, which is extremely fast, but also consumes more current than other technologies such as transistor-transistor logic (TTL) and complementary metal-oxide-semiconductor (CMOS) technologies. As manufacturing processed have improved, it has become possible to combine two or more technologies to receive the benefit of the best features of each. CMOS may be combined with TTL or ECL to provide a circuit that is very fast and which consumes a relatively small amount of power. For example, an integrated circuit memory may have a memory core comprised of CMOS memory cells, but input/output circuits comprised of TTL or ECL logic. The memory will be very fast, but consume only slightly more power than a CMOS-only design, since the high-power TTL or ECL circuitry is confined to those circuits which determine the access time of the memory and which are shared between many or all memory cells.

Figure 1:
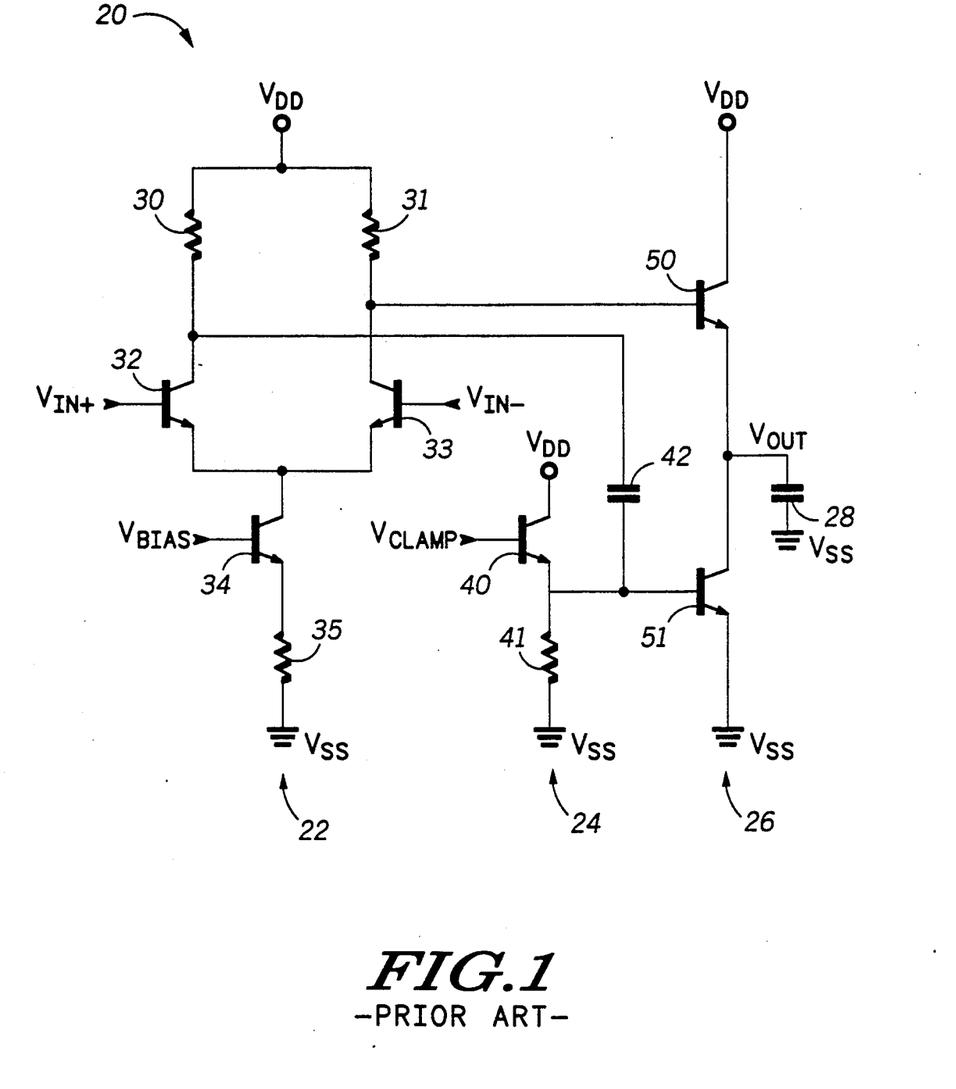
FIG. 1 illustrates in schematic an ECL circuit with reduced quiescent current according to the prior art.

With the emergence of integrated circuit processing techniques capable of fabricating circuits with CMOS and TTL or CMOS and ECL transistors, reducing the high power consumption of TTL or ECL has become more important. FIG. 1 shows a known ECL circuit 20 in which employs a technique to reduce power consumption disclosed in "ECL ICs Play a Role in High-Speed Computers" by John Gallant, *EDN* vol. 34, no. 17, pp. 73-85, 80 (Aug. 17, 1989). Circuit 20 generally comprises in input stage 22, a biasing stage 24, and an output stage 26. Also shown in FIG. 1 is a capacitor 28 forming a load for circuit 20. Input stage 22 comprises resistors 30 and 31; NPN transistors 32, 33, and 34; and a resistor 35. Biasing stage 24 comprises an NPN transistor 40, a resistor 41, and a capacitor 42. Output stage 26 comprises NPN transistors 50 and 51.

Resistors 30 and 31 each have a first terminal connected to a power supply voltage terminal labelled "$V_{DD}$", and a second terminal. $V_{DD}$ is a positive power supply voltage terminal. Transistor 32 has a collector connected to the second terminal of resistor 30, a base for receiving an input signal $V_{IN+}$, and an emitter. Transistor 33 has a collector connected to the second terminal of resistor 31, a base for receiving an input signal $V_{IN-}$, and an emitter. Transistor 34 has a collector connected to the emitters of transistors 32 and 33, a base for receiving a reference voltage labelled "$V_{BIAS}$", and an emitter. Resistor 35 has a first terminal connected to the emitter of transistor 34, and a second terminal connected to a power supply voltage terminal labelled "$V_{SS}$". $V_{SS}$ is a negative power supply voltage terminal. Transistor 40 has a collector connected to a power supply voltage terminal labelled $V_{DD}$, a base for receiving a voltage labelled "$V_{CLAMP}$", and an emitter. Resistor 41 has a first terminal connected to the emitter of transistor 40, and a second terminal connected to $V_{SS}$. Capacitor 42 has a first terminal connected to the second terminal of resistor 30, and a second terminal connected to the emitter of transistor 40. Transistor 50 has a collector connected to $V_{DD}$, a base connected to the second terminal of resistor 31, and an emitter coupled to a load and providing a signal labelled "$V_{OUT}$" thereon. Shown here is a capacitive load represented by a capacitor 28 having a first terminal connected to the emitter of transistor 50, and a second terminal connected to $V_{SS}$. Transistor 51 has a collector connected to the emitter of transistor 50, a base connected to the emitter of transistor 40, and an emitter connected to $V_{SS}$.

In operation, circuit 20 alternately charges and discharges a primarily capacitive load, represented by load capacitor 28, in response to a difference in voltage between $V_{IN+}$ and $V_{IN-}$. Input stage 22 provides true and complementary voltages on the second terminal of resistor 31 and on the second terminal of resistor 30, respectively, in response to a difference in voltage between $V_{IN+}$ and $V_{IN-}$. $V_{BIAS}$ biases transistor 34 to substantially operate as a current source. When the voltage on $V_{IN+}$ rises above $V_{IN-}$, then transistor 32 becomes more conductive than transistor 33, the voltage on the collector of transistor 33 rises, and eventually forward biases the base-emitter junction of transistor 50. The collector-base junction is reverse biased, so transistor 50 provides a charging current into load capacitor 28 as determined by the current gain, or $\beta$, of transistor 50. If the base-emitter diode cutin voltage is labelled "$V_{BE1}$", $V_{OUT}$ rises to approximately $V_{DD} - V_{BE1}$. Note that as the voltage on the second terminal of resistor 30 falls, the voltage on the first terminal of capacitor 42 drops as well, and the excess charge on the second terminal of capacitor 42 discharges through resistor 41 to $V_{SS}$. The voltage on the second terminal of capacitor 42 eventually falls to a low voltage, but is limited by transistor 40 to be no lower than $V_{CLAMP}$ minus $V_{BE40}$, where $V_{BE40}$ is the cutin voltage of the base-emitter diode of transistor 40.

When $V_{IN+}$ falls below $V_{IN-}$, the voltage on the collector of transistor 33 falls, reverse biasing the base-emitter diode of transistor 50. The voltage on the collector of transistor 32 rises, and the voltage on the base of transistor 51 rises in response thereto, due to the coupling effect of capacitor 42. The base-emitter junction of transistor 51 is now forward biased, the collector-base junction is reverse biased, and therefore transistor 51 conducts current from the load to $V_{SS}$ in response to $\beta$ times the base current. However, the voltage on the second terminal of capacitor 42 falls due to the relaxation of current in resistor 41, and also some base current in transistor 51. When eventually the base-emitter junction of transistor 51 is no longer forward biased, no more discharging current can flow from load capacitor 28 to $V_{SS}$.

By making pulldown transistor 51 conductive only when $V_{OUT}$ is still at a logic high, biasing stage 24 ensures that only small amounts of quiescent current flow in circuit 20 after capacitor 28 is discharged by transistor 51. However there is a limitation with this approach because capacitor 42 requires a certain amount of time to charge while $V_{IN+}$ exceeds $V_{IN-}$. For example, if $V_{IN+}$ changes from a logic low to a logic high, and then again back to a logic low quickly, capacitor 28 cannot recharge enough to bias transistor 51 to discharge the load. Therefore circuit 20 is not appropriate for applications in which $V_{IN+}$ and $V_{IN-}$ switch very quickly between states. However, it is well known in the art that such limitations may be tolerable when available manufacturing technology affords no alternatives, as for example when the available manufacturing technology does not include the ability to manufacture PNP transistors.

BRIEF DESCRIPTION OF THE INVENTION

Accordingly, it is an object of the present invention to provide a high speed logic circuit with reduced quiescent current.

It is another object of the present invention to provide a MOS/ECL logic circuit with reduced quiescent current.

It is yet another object of the present invention to provide a logic gate with improved noise immunity by using true and complementary signal pairs.

It is still another object of the present invention to provide method of forming a logic signal using both series gating and collector dotting.

In carrying out these and other objects of the invention, there is provided, in one form, a circuit comprising a logic portion, a biasing portion, first and second bipolar transistors, and a current portion. The logic portion provides first and second signals in response to a predetermined logic operation between a plurality of input signals. The biasing portion is coupled to the logic portion, provides a bias voltage on a node in response to the second signal. The first and second bipolar transistors are serially coupled between first and second power supply voltage terminals, and provide an output signal therebetween. A base of the first bipolar transistor receives the first signal, and a base of the second transistor is coupled to the node. The current portion is coupled to the biasing portion and to the second bipolar transistor, and sinks a current from the node. In one embodiment, the current portion sinks the current in response to the output signal being in a predetermined logic state.

These and other objects, features and advantages will be more clearly understood from the following detailed description taken in conjunction with the accompanying drawings.

DETAILED DESCRIPTION OF THE INVENTION

Figure 2:
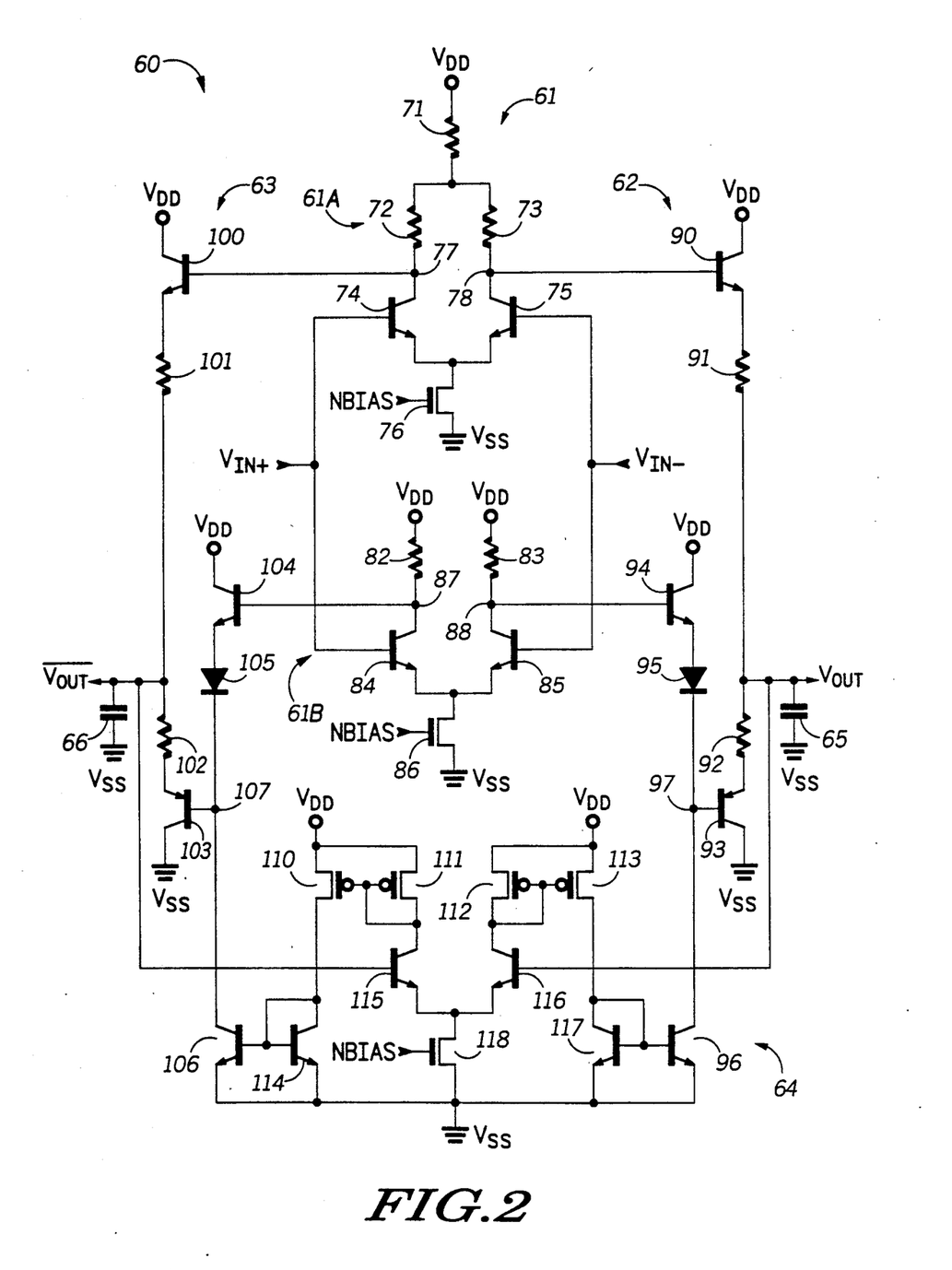
FIG. 2 illustrates in schematic form one embodiment of a high-speed circuit with reduced quiescent current in accordance with the present invention.

FIG. 2 illustrates in schematic form one embodiment of a high-speed circuit 60 in accordance with the present invention. Circuit 60 comprises an input portion 61, a first output portion 62, a second output portion 63, and a current portion 64. Also shown in FIG. 2 is a load capacitor 65, and a load capacitor 66. Load capacitors 65 and 66 each represent an idealized load which is useful in understanding the invention. In reality, circuit 60 couples to loads which are primarily capacitive but have resistive components. Input portion 61 comprises resistor 71, 72, and 73; NPN transistors 74 and 75; and N-channel transistor 76; resistors 82 and 83; NPN transistors 84 and 85; and an N-channel transistor 86. First output portion 62 comprises an NPN transistor 90; resistors 91 and 92; a PNP transistor 93; an NPN transistor 94; and a diode 95. Second output portion 63 comprises an NPN transistor 100; resistors 101 and 102; a PNP transistor 103; an NPN transistor 104; and a diode 105. Current portion 64 comprises N-channel transistors 96 and 106; P-channel transistors 110–113; NPN transistors 114–117; and an N-channel transistor 118.

In input portion 61, resistor 71 has a first terminal connected to a power supply voltage terminal labelled "$V_{DD}$", and a second terminal. $V_{DD}$ is a positive power supply voltage terminal. Resistor 72 has a first terminal connected to the second terminal of resistor 71, and a second terminal connected to a node 77. Resistor 73 has a first terminal connected to the second terminal of resistor 71, and a second terminal connected to a node 78. Transistor 74 has a collector connected to the second terminal of resistor 72, a base for receiving an input signal labelled "$V_{IN+}$", and an emitter. Transistor 75 has a collector connected to the second terminal of resistor 73, a base for receiving a signal labelled "$V_{IN-}$", and an emitter connected to the emitter of transistor 74. Transistor 76 has a drain connected to the emitters of transistors 74 and 75, a gate for receiving a signal labelled "NBIAS", and a second current electrode connected to a power supply voltage terminal labelled "$V_{SS}$". $V_{SS}$ is a negative power supply voltage terminal. Resistor 82 has a first terminal connected to $V_{DD}$, and a second terminal connected to a node 87. Resistor 83 has a first terminal connected to $V_{DD}$, and a second terminal connected to a node 88. Transistor 84 has a collector connected to the second terminal of resistor 82, a base for receiving $V_{IN+}$, and an emitter. Transistor 85 has a collector connected to the second terminal of resistor 83, a base for receiving $V_{IN-}$, and an emitter connected to the emitter of transistor 84. Transistor 86 has a drain connected to the emitters of transistors 84 and 85, a gate for receiving NBIAS, and a second current electrode connected to $V_{SS}$.

In first output portion 62, transistor 90 has a collector connected to $V_{DD}$, a base connected to node 78, and an emitter. Resistor 91 has a first terminal connected to the emitter of transistor 90, and a second terminal connected to load capacitor 65. Resistor 92 has a first terminal connected to the second terminal of resistor 91, and a second terminal. Transistor 93 has an emitter connected to the second terminal of resistor 92, a base coupled to a node 97, and a collector connected to $V_{SS}$. Transistor 94 has a collector connected to $V_{DD}$, a base connected to node 88, and an emitter. Diode 95 has a positive terminal connected to the emitter of transistor 94, and a negative terminal connected to the base of transistor 93.

In second output portion 63, transistor 100 has a collector connected to $V_{DD}$, a base connected to node 77, and an emitter. Resistor 101 has a first terminal connected to the emitter of transistor 100, and a second terminal connected to load capacitor 66. Resistor 102 has a first terminal connected to the second terminal of resistor 101, and a second terminal. Transistor 103 has an emitter connected to the second terminal of resistor 102, a base coupled to a node 107, and a collector connected to $V_{SS}$. Transistor 104 has a collector connected to $V_{DD}$, a base connected to node 87, and an emitter. Diode 105 has a positive terminal connected to the emitter of transistor 104, and a negative terminal connected to the base of transistor 103.

In current portion 64, transistor 96 has a collector connected to the negative terminal of diode 95, a base, and an emitter connected to $V_{SS}$. Transistor 106 has a collector connected to the negative terminal of diode 105, a base, and an emitter connected to $V_{SS}$. Transistor 110 has a source connected to $V_{DD}$, a gate, and a drain. Transistor 111 has a source connected to $V_{DD}$, a gate connected to the gate of transistor 110, and a drain connected to the gates of transistors 110 and 111. Transistor 112 has a source connected to $V_{DD}$, a gate, and a drain connected to the gate of transistor 112. Transistor 113 has a source connected to $V_{DD}$, a gate connected to the drain of transistor 112, and a drain. Transistor 114 has a collector connected to the drain of transistor 110, a base connected to the base of transistor 106 and to the collector of transistor 114, and an emitter connected to $V_{SS}$. Transistor 115 has a collector connected to the drain of transistor 111, a base connected to the first terminal of load capacitor 66, and an emitter. Transistor 116 has a collector connected to the drain of transistor 112, a base connected to the first terminal of load capacitor 65, and an emitter connected to the emitter of transistor 115. Transistor 117 has a collector connected to the drain of transistor 113, a base connected to the base of transistor 96 and to the collector of transistor 117, and an emitter connected to $V_{SS}$. Transistor 118 has a drain connected to the emitters of transistors 115 and 116, a gate for receiving NBIAS, and a source connected to $V_{SS}$.

Circuit 60 provides complementary output signals at ECL logic levels in response to a comparison of two complementary input signals. Output signals are provided while maintaining a low quiescent current, but without a limitation on switching frequency of the input signal associated with circuit 20 of FIG. 1. First, PNP transistors 93 and 103 are used instead of NPN transistors. Second, transistor 94 and 104 and diodes 95 and 105 regulate the voltage on the base of transistors 93 and 103 to properly set the bias points for the PNP transistors 93 and 103. Third, current portion 64 provides base currents to transistors 93 and 103 to conduct current to discharge the respective loads only when the output signal is still a logic high voltage. Fourth, separating difference amplifiers 61A and 61B and inserting series resistor 71 prevents large currents which would occur if both the NPN and the PNP transistors in the output stage are simultaneously conductive (known as crowbarring). It should be readily apparent that circuit 60 is symmetrical since it both receives a differential input signal on $V_{IN+}$ and $V_{IN-}$ and provides a true output signal $V_{OUT}$ and a complementary output signal $V_{\overline{OUT}}$. In another embodiment, a single-ended input signal may be received instead of $V_{IN+}$, with $V_{IN-}$ being provided by a reference voltage. Also, a single output signal may be provided, in which case either a left half or a right half of current portion 64, and a corresponding output portion, may be omitted.

Input portion 61 receives a differential on $V_{IN+}$ and $V_{IN-}$ and provides voltages on nodes 77, 78, 87 and 88 in response. $V_{IN+}$ and $V_{IN-}$ are digital signals which are provided at either a logic high voltage or a logic low voltage. If $V_{IN+}$ is at a logic high and $V_{IN-}$ is at a logic low, the voltages on nodes 78 and 88 are provided at a logic high and the voltages on nodes 77 and 87 are provided at a logic low. If $V_{IN-}$ is at a logic high and $V_{IN+}$ is at a logic low, the voltages on nodes 77 and 87 are at a logic high and the voltages on nodes 78 and 88 are at a logic low. Note that any logic function could be performed between any signals to provide appropriate voltages on nodes 77, 78, 87, and 88; here, a logical compare operation is being performed. Input portion 61 comprises two ECL/MOS difference amplifiers 61A and 61B which differ only in an extra resistor 71 inserted in series with amplifier 61A and $V_{DD}$. Resistor 71 reduces the voltage on the base of transistor 90 below the voltage on the base of transistor 93 when $V_{OUT}$ is a logic high, thus reducing a crowbar current. Besides this difference, the operation of amplifiers 61A and 61B are identical, and the operation of both amplifiers will be described with reference to amplifier 61A. In addition, circuit 60 provides $V_{\overline{OUT}}$ when $V_{IN+}$ exceeds $V_{IN-}$ in the same manner as it provides $V_{OUT}$ when $V_{IN-}$ exceeds $V_{IN+}$, and reference will be made to providing $V_{OUT}$ only.

Signal NBIAS biases MOS transistor 76 to act as a constant current source. A difference between $V_{IN+}$ and $V_{IN-}$ then determines through which transistor substantially all of the constant current flows, and hence determines the voltages on nodes 77 and 78. When $V_{IN+}$ exceeds $V_{IN-}$, transistor 74 conducts substantially all of the constant current flowing through transistor 76, and the voltage on the second terminal of resistor 72 falls. In contrast, relatively little current flows through transistor 75 and resistor 73, so that the voltage on node 78 rises. Node 78 is thus the positive output terminal of amplifier 61A, and node 77 is the negative terminal of amplifier 61A. As the voltage on node 78 rises, the base-emitter junction of transistor 90 becomes forward biased, and current flows into load capacitor 68 until $V_{OUT}$ is approximately at $V_{DD}-V_{BE1}$, where $V_{BE1}$ represents a cutin voltage of the base-emitter diode of transistor 90. However, the current provided by transistor 76 causes a voltage drop across resistor 71, so that the voltage on the second terminal of resistor 71 is somewhat less than $V_{DD}$.

Likewise, the voltage on node 88 also rises, and the base-emitter junction 94 also becomes forward biased. Due to diode 95, the voltage on the base of transistor 93 becomes approximately $V_{DD}-2V_{BE1}$, neglecting the voltage drop due to the base current of transistor 94. (For simplicity, it will be assumed that the cutin voltages of all other transistors are equal to $V_{BE1}$, although this is not necessarily true.) Since $V_{OUT}$ is less than $V_{DD}-V_{BE1}$, therefore, the voltage on the emitter-base junction of transistor 93 is less than $V_{BE1}$, the emitter-base junction is below its cutin voltage, and no current flows through transistor 93. Additionally in current portion 64, when $V_{OUT}$ is high, the base-emitter junction of transistor 116 becomes forward biased. Transistor 118 is a constant current source, and so draws substantially all of its current through transistors 112 and 116. The current is mirrored through transistors 113 and 117, and then mirrored through transistor 96. The current flowing through transistor 96 is provided by transistor 94 and diode 95.

When $V_{IN-}$ then falls below $V_{IN+}$, transistor 75 conducts substantially all of the constant current flowing through transistor 76, and the voltage on node 78 falls. The base-emitter junction of transistor 90 becomes reverse biased, and no current flows into the load. The voltage on node 88 falls also, reverse biasing the base-emitter junction of transistor 94. Since $V_{OUT}$ is temporarily at a logic high, transistor 96 is still mirroring current. The voltage on the base of transistor 93 falls, and the emitter base junction of transistor 93 becomes forward biased and draws the current conducted by transistor 96 from the load. As transistor 93 draws current from the load, capacitor 65 discharges, and $V_{OUT}$ drops. Transistor 96 continues to mirror current until $V_{\overline{OUT}}$ exceeds $V_{OUT}$, at which point substantially no more current flows, since the base-emitter junctions of transistors 90 and 93 are both reverse biased. When transistor 96 stops conducting current, the voltage on the base of transistor 93 rises, the emitter-base diode becomes reverse biased, and no further current flows.

Circuit 60 differs in four primary ways from circuit 20 of FIG. 1. First, the NPN-PNP transistor pair is used for the output stage instead of two NPN transistors in series. Using the PNP device for the pulldown transistor decreases quiescent current significantly because current flows from the load through the emitter-base diode, instead of flowing from the collector to the emitter, which would require continuous base current even after the load has discharged and $V_{OUT}$ is at a logic low. Second, transistor 94 and diode 95 set the appropriate bias point for transistor 93 without requiring a recharge or recovery time, as in circuit 20 of FIG. 1. Third, current portion 64 actively draws current from the load in response to the voltage on $V_{OUT}$, which causes current to flow only during switching. In another embodiment, current portion 64 may be replaced by resistors between node 97 and $V_{SS}$, and node 107 and $V_{SS}$. However, such an embodiment would consume more current and lack the advantage of actively mirroring current of current portion 64. And fourth, separating difference amplifiers 61A and 61B and inserting resistor 71 in series between $V_{DD}$ and difference amplifier 61A helps prevent crowbarring of current which would occur if both transistors 90 and 93 are simultaneously conductive or partially conductive. It should be apparent that second output portion 63 is just a mirror image of first output portion 62. Also, resistors 91 and 92, 101 and 102, are provided to enhance reliability and may be omitted in other embodiments.

Figure 3:
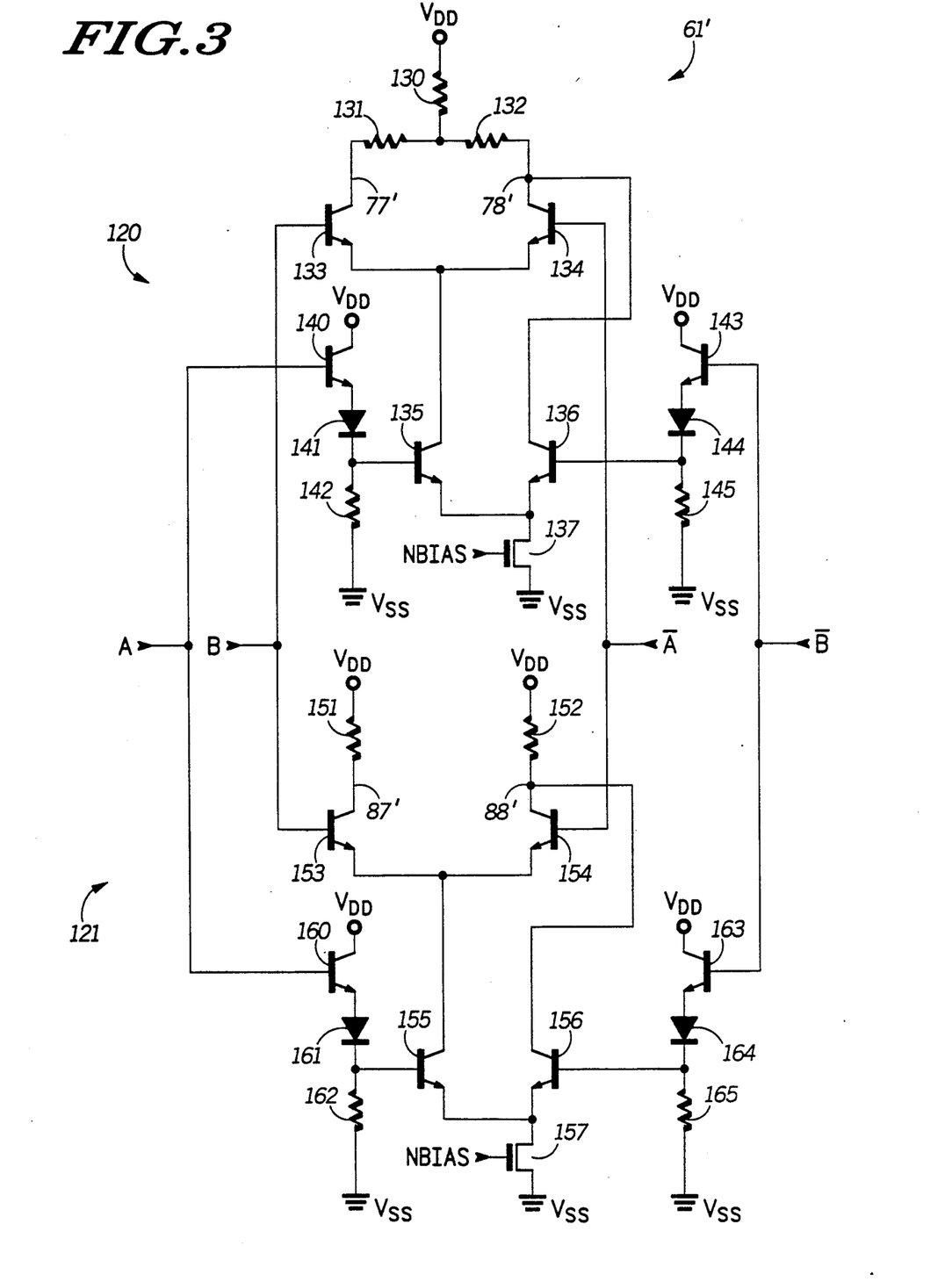
FIG. 3 illustrates in schematic form a circuit which, when used instead of a corresponding portion of the circuit of FIG. 2 forms a second embodiment of a high-speed circuit with reduced quiescent current in accordance with the present invention.

FIG. 3 illustrates in schematic form a circuit which, when used instead of a corresponding portion of the circuit of FIG. 2, forms a second embodiment of a high-speed logic circuit with reduced quiescent current in accordance with the present invention. FIG. 3 shows an input portion 61' for receiving two input signals and their complements, and for providing outputs representing the true and complement logical AND signals of the two input signals. Input portion 61' substitutes for input portion 61 of FIG. 2 and has the same protection against crowbar currents as discussed above. It should be clear that input portion 61' could be constructed to receive only true input signals, or provide either only true, or only complement output signals.

Input portion 61' comprises a first portion 120, and a second portion 121. First portion 120 provides an output voltage on node 78' representing a logical AND of A and B, and provides an output voltage on node 77' representing a complement of a logical AND of A and B. Second portion 121 provides an output voltage on node 88' representing a logical AND of A and B, and provides an output voltage on node 87' representing a complement of a logical AND of A and B. However, each pair of corresponding nodes 77 and 87, and 78 and 88, while having the same logical relation to input signals A and B, are distinct and provide voltages with different signal characteristics. Also, a resistor is added in first portion 120 to prevent crowbar currents as in circuit 60 of FIG. 2. First portion 120 comprises resistors 130, 131, and 132; NPN transistors 133, 134, 135, and 136; an N-channel transistor 137; NPN transistor 140; a diode 141; a resistor 142; and NPN transistor 143; a diode 144; and a resistor 145. Second portion 121 comprises resistors 151 and 152; NPN transistors 153, 154, 155, and 156; an N-channel transistor 157; an NPN transistor 160; a diode 161; a resistor 162; an NPN transistor 163; a diode 164; and a resistor 165.

In first portion 120, resistor 130 has a first terminal connected to $V_{DD}$, and a second terminal. Resistor 131 has a first terminal connected to the second terminal of resistor 130, and a second terminal connected to a node 77'. Resistor 132 has a first terminal connected to the second terminal of resistor 130, and a second terminal connected to a node 78'. Transistor 133 has a collector connected to the second terminal of resistor 131, a base for receiving a first input signal labelled "A", and an emitter. Transistor 134 has a collector connected to the second terminal of resistor 132, a base for receiving a complement of the first input signal labelled "$\overline{A}$", and an emitter connected to the emitter of transistor 133. Transistor 135 has a collector connected to the emitters of transistors 133 and 134, a base, and an emitter. Transistor 136 has a collector connected to node 78', a base, and an emitter connected to the emitter of transistor 135. Transistor 137 has a drain connected to the emitters of transistors 135 and 136, a gate for receiving NBIAS, and a source connected to $V_{SS}$. Transistor 140 has a collector connected to $V_{DD}$, a base for receiving a second input signal labelled "B", and an emitter. Diode 141 has a positive terminal connected to the emitter of transistor 140, and a negative terminal connected to the base of transistor 135. Resistor 142 has a first terminal connected to the negative terminal of diode 141, and a second terminal connected to $V_{SS}$. Transistor 143 has a collector connected to $V_{DD}$, a base for receiving a complement of the second input signal labelled "$\overline{B}$", and an emitter. Diode 144 has a positive terminal connected to the emitter of transistor 143, and a negative terminal connected to the base of transistor 136. Resistor 145 has a first terminal connected to the negative terminal of diode 144, and a second terminal connected to $V_{SS}$.

In second portion 121, resistor 151 has a first terminal connected to $V_{DD}$, and a second terminal connected to a node 87'. Resistor 152 has a first terminal connected to $V_{DD}$, and a second terminal connected to a node 88'. Transistor 153 has a collector connected to the second terminal of resistor 151, a base for receiving A, and an emitter. Transistor 154 has a collector connected to the second terminal of resistor 152, a base for receiving $\overline{A}$, and an emitter connected to the emitter of transistor 153. Transistor 155 has a collector connected to the emitters of transistors 153 and 154, a base, and an emitter. Transistor 156 has a collector connected to node 88', a base, and an emitter connected to the emitter of transistor 155. Transistor 157 has a drain connected to the emitters of transistors 155 and 156, a gate for receiving NBIAS, and a source connected to $V_{SS}$. Transistor 160 has a collector connected to $V_{DD}$, a base for receiving B, and an emitter. Diode 161 has a positive terminal connected to the emitter of transistor 160, and a negative terminal connected to the base of transistor 155. Resistor 162 has a first terminal connected to the negative terminal of diode 161, and a second terminal connected to $V_{SS}$. Transistor 163 has a collector connected to $V_{DD}$, a base for receiving $\overline{B}$, and an emitter. Diode 164 has a positive terminal connected to the emitter of transistor 163, and a negative terminal connected to the base of transistor 156. Resistor 165 has a first terminal connected to the negative terminal of diode 164, and a second terminal connected to $V_{SS}$.

Input portion 61' performs a logical AND operation on signals A and B, which are input along with their logical complements $\overline{A}$ and $\overline{B}$. Nodes 77', 78', 87', and 88' correspond to nodes 77, 78, 87, and 88 of circuit 60 of FIG. 2, and when input portion 61' is used in place of input portion 61 of FIG. 2, $V_{OUT}$ and $V_{\overline{OUT}}$ become true and complement output signals of the logical AND of A and B. Input portion 61' provides an improvement over traditional ECL technology techniques by combining series gating and collector dotting. Series gating is a technique whereby emitter coupled transistor pairs are inserted in series with other emitter coupled transistor pairs and essentially cascaded. In input portion 61', transistors 135 and 136 form an emitter coupled transistor pair for receiving level-shifted signals B and $\overline{B}$. In series with the first transistor of the emitter coupled transistor pair, transistor 135, is another emitter coupled transistor pair 133 and 134, receiving signals A and $\overline{A}$. The top emitter coupled pair of transistors 133 and 134 is then resistively coupled to $V_{DD}$, and a current sink to $V_{SS}$ is coupled to the emitters of the bottom emitter coupled transistor pair. The technique of collector dotting comprises coupling the collector of the second transistor in the second emitter coupled pair, 134, to the collector of the second transistor of the first emitter coupled pair, 136. The output signals on nodes 78' and 77' are provided on the collectors of transistors 134 and 133, respectively.

Input portion 61' combines the techniques of series gating and collector dotting, which has certain advantages for high speed logic circuits. First, combining series gating with collector dotting provides both the true and complement output signals, saving an inversion delay which would be required in certain applications. Second, combining these techniques allows circuits to be implemented using true and complement input signals, which reduces noise in relation to a reference level.

Figure 4:
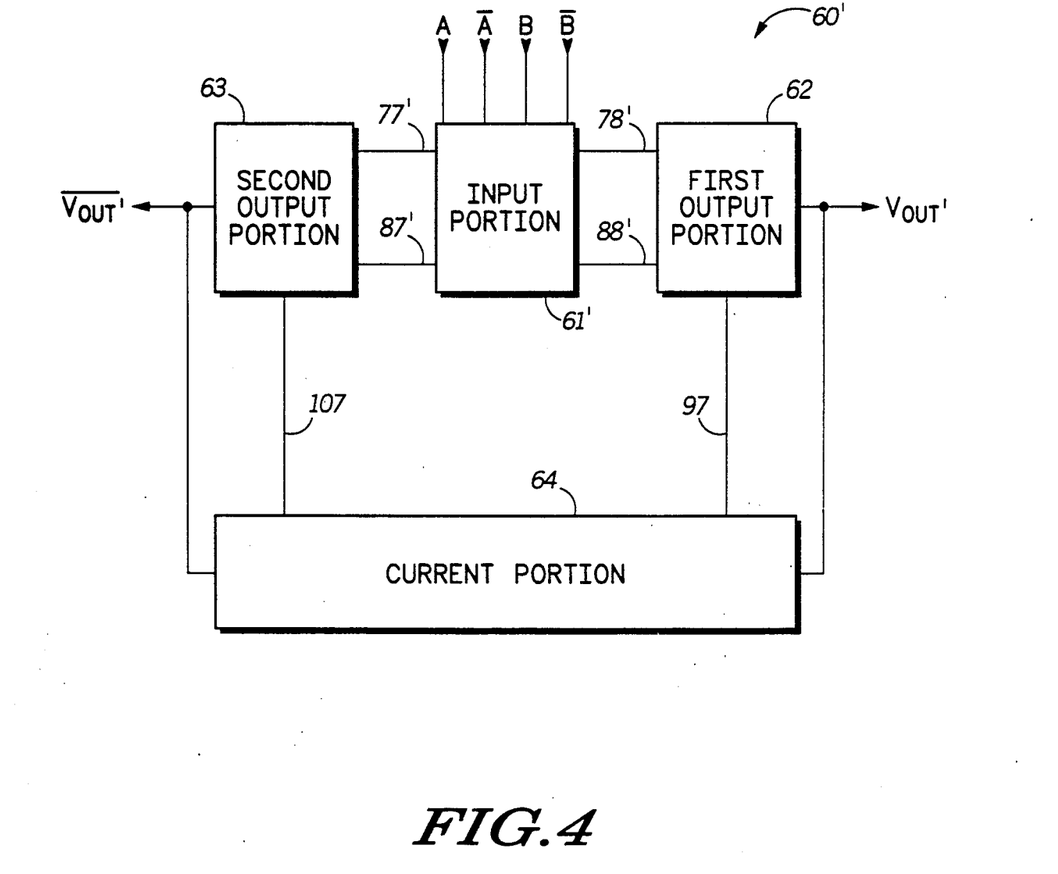
FIG. 4 illustrates in block diagram form the second embodiment of a high-speed circuit which substitutes the circuit of FIG. 3 for a corresponding portion of the circuit of FIG. 2.

FIG. 4 illustrates in block diagram form the second embodiment of a high-speed circuit 60' which substitutes input portion 61' of FIG. 3 for input portion 61 of circuit 60 of FIG. 2. Circuit 60' is useful in understanding how input portion 61' of FIG. 3 is substituted for input portion 61 of high speed circuit 60 of FIG. 2 to form another embodiment of the present invention. Circuit 60' comprises four blocks: input portion 61', numbered as in FIG. 3; and first output portion 62, second output portion 63, and current portion 64, each numbered as in FIG. 2. Input portion 61', performing a logical AND operation, receives signals A, $\overline{A}$, B, and $\overline{B}$. It couples output signals onto nodes 77', 78', 87', and 88' as described above. First output portion 62 is coupled to nodes 78' and 88', instead of nodes 78 and 88 as illustrated in FIG. 2. In response, first output portion 62 provides a signal labelled "$V_{OUT}$" as a logical AND of A and B in a manner described in FIG. 2. Similarly, second output portion 63 is coupled to nodes 77' and 87', instead of nodes 77 and 87 as illustrated in FIG. 2. In response, second output portion 63 provides a signal labelled "$V_{\overline{OUT}}$" as a complement of a logical AND of A and B. Current portion 64 is coupled to nodes 97 and 107, and also receives $V_{OUT'}$. Input portion 61' represents another embodiment of the present invention wherein a different function is provided in input portion 61'. However circuits 60 and 61' are not intended to be exhaustive of the functions which could be provided by an input portion and many others are possible.

It should be apparent by now that a high speed circuit using MOS and bipolar transistors with reduced quiescent current has been described. The circuit comprises an input stage, an output stage, and a current portion. The input stage in one embodiment comprises two ECL difference amplifiers providing an output voltage in response to a difference between an input signal and its complement. The output stage comprises an NPN pullup transistor connected in series with a PNP pulldown transistor between positive and negative power supply voltage terminals and providing an output signal therebetween. In one embodiment the output voltage signal is provided between two resistors which are coupled in series between the pullup and the pulldown transistor. The output stage also comprises a biasing portion to properly set the bias voltage on the pulldown transistor. The current portion senses the voltage on the output signal and draws a current from the output portion when the output signal switches low. The circuit reduces quiescent current by using the PNP pulldown transistor and by dynamically biasing the transistor to become conductive only until the voltage reaches a logic low.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A circuit comprising:
   logic means for performing a logical AND operation between a plurality of input signals, and for providing first and second signals at first and second voltages in response to said predetermined logic operation, said first voltage less than said second voltage;
   biasing means, coupled to said logic means, for providing a bias voltage on a node in response to said second signal;
   first and second bipolar transistors serially coupled between first and second power supply voltage terminals and providing an output signal therebetween, a base of said first bipolar transistor for receiving said first signal, and a base of said second transistor coupled to said node, said first and second bipolar transistors having opposite conductivity types; and
   current means coupled to said biasing means and to said second bipolar transistor, for sinking a current from said node.

2. The circuit of claim 1 wherein said logic means comprises:
   a current sink, for sinking a predetermined current into a first power supply voltage terminal;
   a first transistor having a collector, a base for receiving a first input signal, and an emitter coupled to said current sink;
   a second transistor having a collector, a base for receiving a complement of said first input signal, and an emitter coupled to said emitter of said first transistor;

a third transistor having a collector for providing a complement AND signal, a base for receiving a second input signal, and an emitter coupled to said collector of said first transistor;

a fourth transistor having a collector for providing a true AND signal, a base for receiving a complement of said second input signal, and an emitter coupled to said emitter of said third transistor; and pullup means coupled to said collectors of said third and fourth transistors, for resistively coupling said collectors to a second power supply voltage terminal;

wherein said collector of said second transistor is coupled to said collector of said fourth transistor.

3. The circuit of claim 1 wherein said logic means comprises:

a first resistor having a first terminal coupled to said first power supply voltage terminal, and a second terminal;

a second resistor having a first terminal coupled to said second terminal of said first resistor, and a second terminal;

a third resistor having a first terminal coupled to said second terminal of said first resistor, and a second terminal;

a first transistor having a collector coupled to said second terminal of said second resistor, a base for receiving a first input signal, and an emitter;

a second transistor having a collector coupled to said second terminal of said third resistor, a base for receiving a second input signal, and an emitter coupled to said emitter of said first transistor;

a third transistor having a collector coupled to said emitters of said first and second transistors, a base for receiving a third input signal, and an emitter;

a fourth transistor having a collector coupled to said collector of said second transistor, a base for receiving a fourth input signal, and an emitter coupled to said emitter of said second transistor;

a first current sink for sinking a first predetermined current from said emitters of said third and fourth transistors to said second power supply voltage terminal;

a fourth resistor having a first terminal coupled to said first power supply voltage terminal, and a second terminal;

a fifth resistor having a first terminal coupled to said first power supply voltage terminal, and a second terminal;

a fifth transistor having a collector coupled to said second terminal of said fourth resistor, a base for receiving said first input signal, and an emitter;

a sixth transistor having a collector coupled to said second terminal of said fifth resistor, a base for receiving said second input signal, and an emitter coupled to said emitter of said fifth transistor;

a seventh transistor having a collector coupled to said emitters of said fifth and sixth transistors, a base for receiving said third input signal, and an emitter;

an eighth transistor having a collector coupled to said collector of said sixth transistor, a base for receiving said fourth input signal, and an emitter coupled to said emitter of said seventh transistor;

a second current sink for sinking a second predetermined current from said emitters of said seventh and eighth transistors to said second power supply voltage terminal.

4. The circuit of claim 3 wherein said third input signal is a level shifted complement of said second input signal, and wherein said fourth input signal is a level shifted complement of said first input signal.

5. A circuit comprising:

input means, for receiving true and complement input signals and for providing first and second signals in response to a difference between said true and complement input signals;

a first transistor having a collector coupled to a first power supply voltage terminal, a base for receiving said first signal, and an emitter;

a first resistor having a first terminal coupled to said emitter of said first transistor, and a second terminal for providing a true output signal;

a second resistor having a first terminal coupled to said second terminal of said first resistor, and a second terminal;

a second transistor having an emitter electrode coupled to said second terminal of said second resistor, a base for receiving a first biasing signal, and a collector coupled to a second power supply voltage terminal;

a third transistor having a collector coupled to said first power supply voltage terminal, a base for receiving said second signal, and an emitter;

a third resistor having a first terminal coupled to said emitter of said third transistor, and a second terminal for providing a complement output signal;

a fourth resistor having a first terminal coupled to said second terminal of said third resistor, and a second terminal;

a fourth transistor having a emitter coupled to said second terminal of said fourth resistor, a base for receiving a second biasing signal, and a collector coupled to said second power supply voltage terminal; and biasing means coupled to said base of said second transistor and to said base of said fourth transistor, for providing said first and second biasing signals in response to said true output signal being in a predetermined logic state, and comprising:

a fifth transistor having a collector coupled to said first power supply voltage terminal, a base for receiving said first signal, and an emitter;

a first diode having a positive terminal coupled to said emitter of said fifth transistor, and a negative terminal for providing said first biasing signal;

a sixth transistor having a collector coupled to said first power supply voltage terminal, a base for receiving said second signal, and an emitter;

a second diode having a positive terminal coupled to said emitter of said sixth transistor, and a negative terminal for providing said second biasing signal; and current means coupled to said base of said second transistor and to said base of said fourth transistor, for providing first and second reference currents respectively on said bases of said second transistor and said base of said fourth transistor, in response to said true and complement output signals.

6. A method of providing true and complement output signals representing a logical AND of first and second input signals, comprising the steps of:

providing a first emitter coupled transistor pair having a first base for receiving said first input signal and having a second base for receiving a complement of said first input signal;

providing a second emitter coupled transistor pair having a first base for receiving said second input signal and having a second base for receiving a complement of said second input signal;

series gating said second emitter coupled transistor pair with a collector of a first transistor of said first emitter coupled transistor pair;

collector dotting second transistors in said first and second emitter coupled transistor pairs;

resistively coupling first and second collectors of said second emitter coupled transistor pair to a first power supply voltage terminal;

sinking a predetermined current from said emitters of said first emitter coupled transistor pair to a second power supply voltage terminal; and providing said true and complement output signals on said collectors of said second emitter coupled transistor pair.

7. A circuit comprising:

logic means for performing a predetermined logic operation between a plurality of input signals, and for providing first and second signals at first and second voltages in response to said predetermined logic operation, said first voltage less than said second voltage;

biasing means, coupled to said logic means, for providing a bias voltage on a node in response to said second signal, and comprising:
- a third transistor having a collector coupled to said first power supply voltage terminal, a base for receiving said second signal, and an emitter; and
- a diode having a positive terminal coupled to said emitter of said third transistor, and a negative terminal coupled to said node;

first and second bipolar transistors serially coupled between first and second power supply voltage terminals and providing an output signal therebetween, a base of said first bipolar transistor for receiving said first signal, and a base of said second transistor coupled to said node, said first and second bipolar transistors having opposite conductivity types; and current means coupled to said biasing means and to said second bipolar transistor, for sinking a current from said node, said current means sinking a current from a said node in response to said output signal being in a predetermined logic state.

8. A logic circuit comprising:

first logic means, for performing a predetermined logic operation on at least one input signal, and for providing a first signal in response;

second logic means, for performing said predetermined logic operation on said at least one input signal, and for providing a second signal in response, a logic high voltage of said second signal being less than a logic high voltage of said first signal;

a first transistor having a collector coupled to a first power supply voltage terminal, a base for receiving said first signal, and an emitter coupled to an output node;

bias means, coupled to said second logic means, for providing a third signal at two forward biased base-to-emitter diode voltage drops less than said second signal; and a second transistor having an emitter coupled to said output node, a base for receiving said third signal, and a collector coupled to a second power supply voltage terminal.

9. The logic circuit of claim 8, wherein said bias means comprises:
- a third transistor, having a collector coupled to said first power supply voltage terminal, a base for receiving said second signal, and an emitter; and
- a diode having a positive terminal coupled to said emitter of said third transistor, and a negative terminal coupled to said base of said second transistor and providing said third signal thereon.

10. The logic circuit of claim 8, wherein said first logic means comprises:
- a first resistor having a first terminal coupled to said power supply voltage terminal, and a second terminal;
- a second resistor having a first terminal coupled to said second terminal of said first resistor, and a second terminal for providing said first signal;
- a third resistor having a first terminal coupled to said second terminal of said first resistor, and a second terminal;
- a third transistor, having a collector coupled to said second terminal of said second resistor, a base for receiving said said input signal, and an emitter;
- a fourth transistor having a collector coupled to said second terminal of said third resistor, a base for receiving a second input signal, and an emitter coupled to said emitter of said third transistor; and
- a current source for sinking a predetermined current from said emitters of said second and third transistors to said second power supply voltage terminals.

11. The logic circuit of claim 10, wherein said second logic means comprises:
- a fourth resistor having a first terminal coupled to said first power supply voltage terminal, and a second terminal for providing said second signal;
- a fifth resistor having a first terminal coupled to said first power supply voltage terminal, and a second terminal;
- a fifth transistor, having a collector coupled to said second terminal of said fourth resistor, a base for receiving said said input signal, and an emitter;
- a sixth transistor having a collector coupled to said second terminal of said fifth resistor, a base for receiving a second input signal, and an emitter coupled to said emitter of said third transistor; and
- a second current source for sinking a predetermined current from said emitters of said second and third transistors to said second power supply voltage terminals.

* * * * *